United States Patent [19]

Masuda

[11] 3,731,074

[45] May 1, 1973

[54] DECIMAL-BINARY CODE CONVERSION SYSTEM

[75] Inventor: Noboru Masuda, Kawaguchi, Japan

[73] Assignee: Denki Onkyo Co., Ltd., Tokyo, Japan

[22] Filed: Mar. 12, 1971

[21] Appl. No.: 123,748

[30] Foreign Application Priority Data

Mar. 12, 1970 Japan ....................45/21013

[52] U.S. Cl. .........235/155, 340/365 L, 340/347 DD

[51] Int. Cl.....G06f 5/02, H03k 13/24, H03k 13/247

[58] Field of Search....................235/155; 340/365 L, 340/166 C, 365 R; 323/74, 75; 324/59

[56] References Cited

UNITED STATES PATENTS

| | | | |
|---|---|---|---|
| 2,997,703 | 8/1961 | Powell | 340/365 L |
| 3,129,418 | 4/1964 | De La Tour | 340/365 L |
| 3,119,996 | 1/1964 | Comstock | 340/365 L |
| 3,536,932 | 10/1970 | Humbert-Droz | 340/365 L |
| 3,612,241 | 10/1971 | Bernin | 340/365 L |

OTHER PUBLICATIONS

IBM Technical Disclosure Bulletin, McDowell et al., "Magnetoresistive Contact-Less Switch," Vol. 12, No. 3, August 1969, p. 436, 437

IBM Technical Disclosure Bulletin, Harper et al., "Encoder," Vol. 10, No. 9, Feb. 1968, p. 1374, 1375

IBM Technical Disclosure Bulletin, Steckenrider, "Electromagnetic Keyboard," Vol. 12, No. 4, Sept. 1969, p. 612

*Primary Examiner*—Maynard R. Wilbur
*Assistant Examiner*—Thomas J. Sloyan
*Attorney*—James E. Armstrong and Ronald S. Cornell

[57] ABSTRACT

A decimal-binary code conversion system wherein four amplifying circuits are formed by respectively connecting four magnetro-resistance effect devices formed as a bridge circuit to each of four amplifiers which produce different output signals, four different numerical values being binary-coded with independent operation of four amplifying circuits, and six numerical values being binary-coded with composite operations of the two of four amplifying circuits.

6 Claims, 5 Drawing Figures

DECIMAL-BINARY CODE CONVERSION SYSTEM

BACKGROUND OF THE INVENTION

The present invention relates to a decimal-binary code conversion system which employs a plurality of magnetro-resistance effect devices.

In the case of conventional computers, diode matrixes are employed in the encoder for decimal-binary code conversion, the diode matrixes being provided with a mechanical switching mechanism of the key button type. Such a diode matrix thus is disadvantageous because the switching portion wears quickly with chattering (or banding) causing erroneous operation.

Recently, for this reason, it has been proposed to employ the so-called "contactless" e.g., a magnetro-resistance effect device, within a magnetic circuit instead of a key button.

It is known, however, that this type of switching means does not perform on-off operation instantaneously. Since the magnetro-resistance effect device is temperature dependent, it is necessary to provide a comparator to compensate for temperature variations by using the magentro-resistance effect device with a resistor which permits the setting of the operating point of the amplifying circuit.

In the case of a computer employing the magnetro-resistance effect devices as the component device of the switching means as mentioned above, the matrix circuit has employed 16 diodes, and ten amplifiers corresponding to the value from 0 to 9 thus ten sets of the magnetro-resistance effect devices, twenty in total, are required for the key buttons. Further, the comparator must be connected to this matrix circuit. Necessarily, these computers are disadvantageous because the high cost of the devices and other components, leading to high production costs.

The present invention provides a code conversion system which is free from the above disadvantages.

SUMMARY

A decimal-binary code conversion system is provided which comprises four amplifying circuits formed with four code signal amplfiiers. Each amplifier has connected thereto four magnetro-resistance effect devices arranged in a bridge circuit. The bridge circuits are provided with magnetic field applying means which actuate selectively any one of the four magnetro-resistance effect therein, the field applying means being constructed and arranged so that the code signal is generated from the signal amplifier to which the bridge circuit pertains when the bridge circuit is unbalanced. The four devices of each amplifying circuit are classified into a single device which codes independently a specified numerical value and three devices which code specified numerals when combined individually with one device of another amplifying circuit.

Four amplifying circuits are thus provided with four independent devices which code four numerical values and six pairs of combined devices which code six numerical values, each device of each pair of combined devices being selected from a different amplifying circuit and the combinations of the amplifying circuits for each pair of devices is different. The amplifying circuits are thus designed so that four numerical values are coded when said amplifiers individually generate the code signals and so that six numerical values are coded by combining any two of the four amplifiers and diversifying the output code signals into six different combinations in accordance with the combinations of amplifiers.

BRIEF DESCRIPTION OF THE DRAWINGS

The present invention is illustrated in detail in the accompanying drawings wherein.

DETAILED DESCRIPTION

Figure 1:
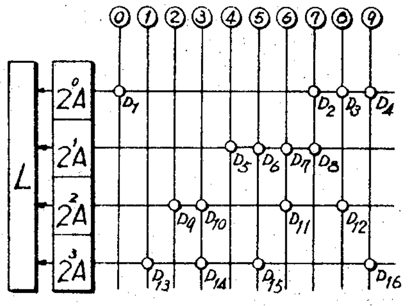
FIGS. 1 and 2 show the rules of code conversion in the system according to the present invention.
Figure 2:
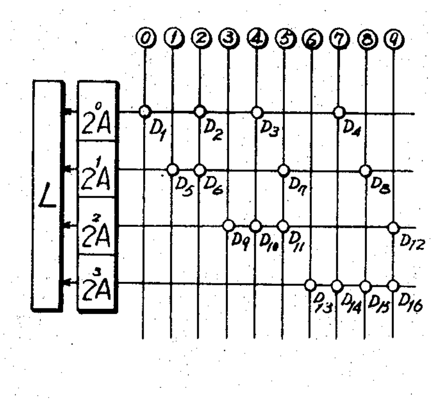

FIGS. 1 and 2 show the rules for code conversion of decimal values from 0 –9 into binary values.

Figure 3:
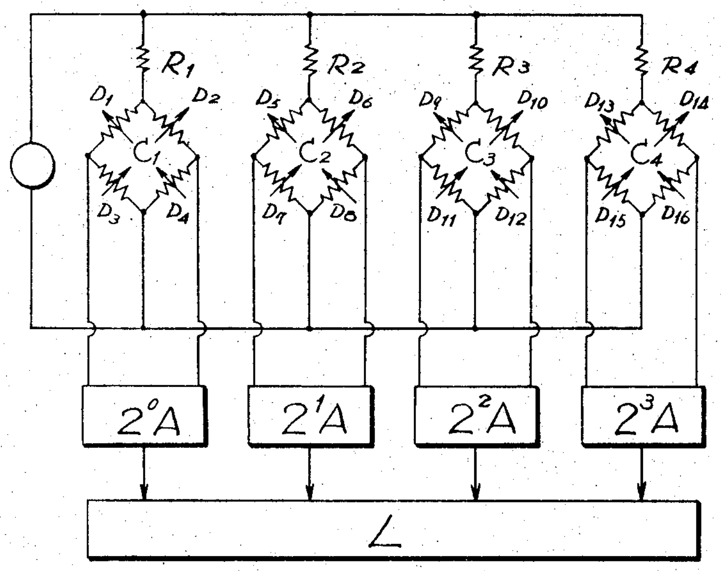
FIG. 3 is a circuit diagram for the system according to the present invention.

Logic circuit L is connected to four amplifiers as the source of input signals, that is, amplifier $2^0$A which generates $2^0$ code signals, amplifier $2^2$A which generates $2^2$ code signals, and amplifier $2^3$A which generates $2^3$ code signals, Four magnetro-resistance effect devices $D_1$, $D_2$, $D_3$ and $D_4$ (each hereinafter referred to as "device") are connected to amplifier $2^0$A, four devices $D_5$, $D_6$, $D_7$ and $D_8$ to amplifier $2^1$A, four devices $D_9$, $D_{10}$, $D_{11}$ and $D_{12}$ to amplifier $2^2$A, and four devices $D_{13}$, $D_{14}$, $D_{15}$ and $D_{16}$ to amplifier $2^3$A, thus forming four amplifying circuits. As shown in FIG. 3, four sets of the devices, each set being comprised of four devices, connected to the amplifiers form four bridge circuits, $C_1$, $C_2$, $C_3$ and $C_4$, the amplifiers being respectively connected to the output terminals of all of the bridge circuits.

The devices of the bridge circuits fall into two classifications one device which independently produces a code signal of a specified value, that is, device $D_1$ of the bridge circuit for amplifier $2^0$A in FIG. 1; and three devices which produce the codes of specified values while being combined with another device.

Accordingly, 16 devices forming four bridge circuits are classified into four devices which independently code four numerical values and six pairs of combination devices which code six values in combinations of two devices.

Thus, one of the bridge circuits may be actuated to convert a code through one device. Accordingly, it is satisfactory if the system is designed so that one of amplifiers $2^0$A, $2^1$A, $2^2$A and $2^3$A operates when the magnetic flux is applied to the device which forms one arm of the bridge circuit such as, for example, $D_1$, $D_5$, $D_9$ and $D_{13}$, as the key.

Accordingly, this system permits coding four numerical values in relation to the $2^0$ code signal, the $2^1$ code signal, the $2^2$ code signal and the $2^3$ code signal, respectively. On the other hand, six numerical values are converted into codes by the groups of devices which are combined in sets of two. The following conditions are necessary for coding these numerical values.

First, two devices which are combined should not be contained in the same amplifying circuit. In other words, it is necessary to code specified numerical values using two kinds of code signals by actuating two devices to cause two amplifiers to function at the same time.

Second, the amplifying circuit to which two devices pertain should be in a different combination for each numerical value. Accordingly, the combinations of the code signals which are used for coding six numerical values should be different from each other.

The above conditions are satisfied with four amplifying circuits and 16 devices, each group of four of which is connected to each amplifying circuit.

The following describes the relationship between said conditions and the number of devices and the amplifying circuits.

The number of devices which can independently code one numerical value is four, the same as the number of amplifying circuits; the number of remaining devices is 12. Accordingly, six numerical values may be coded by combining each group of two of the twelve devices.

Since 12 devices are equal to the total number of three of the four devices connected to each amplifying circuit, except the one device which independently codes the numerical value, six combinations can be obtained by combining the devices which are associated with the different amplifying circuits in twos so that combinations of the amplifying circuits are different from each other.

Hereupon it may be freely determined which device codes the specified numerical value. The rules for coding are determined in advance in the logic circuit.

As shown in FIGS. 1 and 2, several types of relationships between the devices and numerical values may be considered.

Figures 4, 5:
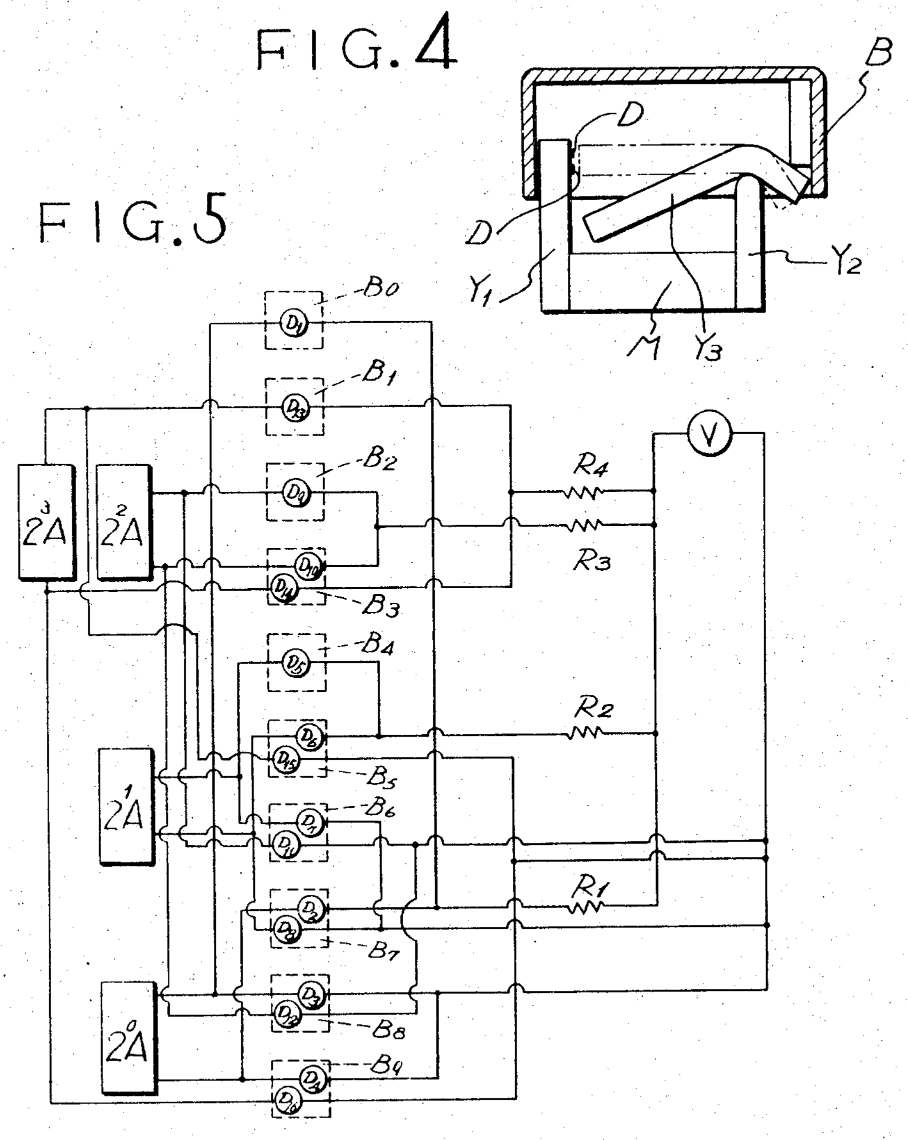
FIG. 4 is a partial cross sectional side view of an example of a key mechanism being employed in the system according to the present invention.
FIG. 5 is an embodiment of the circuit used for said key button.

When using the system according to the present invention, the contactless switch, i.e. the magnetic path which is used as a means to apply the magnetic field provided in the key mechanism, may be made by incorporating the device or devices which can be arranged as shown in FIG. 4.

The following describes the construction of the key mechanism. Symbol M indicates a permanent magnet, having fixed yokes y1 and y2 are arranged oppositely.

One or two magnetro-resistance effect devices D are fixed at the internal surface of fixed yoke y1 and a slider type or rotary type moving yoke, such as rotary yoke y3 is mounted to fixed yoke y2 so that the moving yoke may rotate at the free end of fixed yoke y2 as the fulcrum and the moving end of the moving yoke may approach the device or devices fixed to the fixed yoke.

The magnetic path consisting of the magnet, a pair of the fixed yokes and a moving yoke is capped with push button B. When this push button is depressed, moving yoke y3 turns as shown with a broken line and the magnetic flux may be concentrated onto device or devices D.

If this switch is used as the key mechanism, the resistance of a device forming one arm of the bridge circuit may be varied by depressing push button B and the amplifier connected to the device may be actuated. Therefore, if 10 push buttons which serve as key mechanisms are arranged in parallel as shown in FIG. 5 (corresponding to FIG. 1) and magnetro-resistance effect devices $D_1$ to $D_{16}$ which code 10 numerical values are provided, the resistance of device $D_1$ shown in FIGS. 1 and 3 may be varied by depressing a specified push button such as, for example, push button Bo corresponding to numerical value zero 0 to actuate amplifier $2^0$A for the $2^0$ code signal and the code of numerical value zero and the given $2^0$ code signal may be sent to logic circuit If push button $B_3$ is depressed similarly, the magnetic flux may be concentrated onto devices $D_{10}$ and $D_{14}$ at the same time, and the combined code signal of the $2^2$ code signal and the $2^3$ code signal, specified as the code of numerical value 3, may be sent to logic circuit L by actuating amplfiier $2^2$A for the $2^2$ code signal and amplifier $2^3$A for the $2^3$ code signal shown in FIGS. 1 and 3.

In the diagram symbols R1, R2, R3 and R4 are the compensating resistors provided in the bridge circuits of the amplifying circuits and symbol V is the DC or AC power supply which supplies pulse signals such as, for example, clock pulse signals to the bridge circuits.

The system according to the present invention as mentioned above provides the advantages mentioned below.

The 10 amplifiers which have been required in the past are reduced to four.

Since the diode matrix circuits which have been conventionally used are unnecessary, 16 diodes may be eliminated.

Since the amplifier circuits can be formed with 16 magnetro-resistance effect devices, the number of magnetro-resistance effect devices may be reduced to four less than that of the conventional circuit.

Since four magnetro-resistance effect devices are provided in the amplifying circuit to form the bridge circuit, the resistance values of the arms of the bridge circuit vary equivalently in reference to variation of the temperature. Therefore, the temperature dependency of the devices may be eliminated without a separate temperature compensating means.

Since the key buttons may be integral with the encoder, the entire circuit formation can be simplified and the parts and devices may be reduced in number or omitted as mentioned above, thus vastly reducing the production cost.

Since the signal amplifier operates when the bridge circuit is unbalanced, the amplifying circuits may be easily connected to any logic circuit using MOS devices or bipolar devices regardless of the magnitude of the power supply voltage.

For the above reasons, the system according to the present invention will bring about a great advantage to various types of counters and computers for which the demand will increase more and more.

What is claimed is:

1. A decimal-binary code conversion system comprised of four amplifying circuits formed with four amplifiers, said amplifiers including a $2^0$ code signal amplifier, a $2^1$ code signal amplifier, a $2^2$ code signal amplifier and a $2^3$ code signal amplifier, each of the amplifiers having connected thereto four magnetro-resistance effect devices arranged to provide each amplifying circuit with a bridge circuit formed with the four devices, the bridge circuits being provided with magnetic field applying means which actuate selectively any one of the four devices which form a bridge circuit, said field applying means being constructed and arranged so that a code signal is generated from the signal amplifier to which the bridge circuit pertains when the bridge circuit is unbalanced, the four devices of each amplifying circuit being adapted to provide for one device which codes independently a specified numerical value and three devices which code specified numerical values when combined individually with one device of another bridge circuit associated with another amplifying circuit to form a pair, thereby providing the four amplifying circuits with four independent devices which code four numerical values and six pairs of combined devices which code six numerical values, said pairs of combined devices being formed under the conditions that each device of a pair is selected from a different amplifying circuit and the combinations of the amplifying circuits for each pair of devices is different, thus providing six different numerical values, the amplifying circuits being thus arranged so that four numerical values are coded when said amplifiers independently generate the code signals and so that six numerical values are coded by combining any two of the four amplifiers and diversifying the output code signals into six different combinations in accordance with the combinations of the amplifying circuits.

2. A decimal-binary code conversion system according to claim 1, wherein ten key mechanisms are employed as magnetic field applying means, each being comprised of (a) one permanent magnet, (b) a pair of fixed yokes arranged oppositely at both pole ends of the permanent magnet, (c) a rotary yoke which is mounted on one of the fixed yokes so that a free end of the fixed yoke serves as the fulcrum for rotary yoke and the moving end of the rotary yoke is extended toward the other fixed yoke and (d) a push button which is capped on the magnetic path so that the rotary yoke is rotated when the push button is depressed, and (e) at least one magnetro-resistance effect device which codes numerical values at the internal surface of the fixed yoke positioned opposite to the moving end of the rotating yoke so that the magnetic flux which is applied to the device varies with the movement of the rotary yoke.

3. A decimal-binary code conversion system according to claim 1, wherein ten key mechanisms are employed as magnetic field applying means, each being comprised of (a) a permanent magnet, (b) a pair of fixed yokes, arranged oppositely, at both ends of the permanent magnet, (c) a moving yoke which is disposed for movement relative to said fixed yokes with one end arranged in proximate relation to one fixed yoke and the opposite end is extended toward the other fixed yoke, and (d) a push button which is capped on the magnetic path so that the moving yoke is moved when the push button is depressed, and (e) at least one magnetro-resistance effect device which codes numerical values at the internal surface of the fixed yoke positioned opposite to one end of the moving yoke so that the magnetic flux which is applied to the device varies with the movement of the moving yoke.

4. A decimal code conversion system according to claim 3, wherein the moving yoke is a slider yoke.

5. A decimal-binary code conversion system having four amplifying circuits, said amplifying circuits comprising a. four code signal amplifiers;
b. four magnetro-resistance effect devices connected to each of said amplifiers and arranged to provide each of the amplifying circuits with a bridge circuit, the four devices of each amplifying circuit consisting of
   1. one device which independently codes a specified numerical value and
   2. three devices which code specified numerical values when combined individually with one device of another of the amplifying circuits to form a pair, six individual pairs being formed in such a way that the combination of the amplifying circuits for each pair of devices is different; and
c. Magnetic field applying means associated with each of said bridge circuits so as to acutate selectively any one of the four devices which form the bridge circuit, said magnetic field applying means being constructed and arranged so that a code signal is generated from the signal amplifier associated with a particular bridge circuit when the bridge circuit is unbalanced, the amplifying circuits being thus arranged so that four numerical values are coded when said amplifiers independently provide the code signals and so that six numerical values are coded by combining the code signals of anv two of the four amplifiers and diversifying the output code signals into six different combinations.

6. A decimal-binary code conversion system comprising a. four bridge circuits, each comprising four magnetro-resistance effect device and a pair of output terminals connected to said devices;
b. four code signal amplifiers, each connected respectively to a different one of said pairs of said output terminals of said bridge circuits for emitting a code signal in response to an unbalance in the corresponding bridge circuit; and
c. 10 field applying means adapted to selectively actuate said magnetro-resistance effect devices to cause unbalances in said bridge circuits, four of said field applying means each being adapted to change the resistance value of a given magnetro-resistance device in a different one of said bridge circuits, six of said field applying means each being adapted to change the resistance value of a magnetro-resistance device selected from each of two different bridge circuits, sid six field applying means being arranged to create unbalance in different combinations of said bridge circuits, whereby said amplifiers are adapted to indendently emit four different code signals and to collectively emit in pairs six other different code signals.

* * * * *